US007686129B2

(12) United States Patent
Delgado, Jr.

(10) Patent No.: US 7,686,129 B2
(45) Date of Patent: Mar. 30, 2010

(54) ACOUSTIC HORN HAVING INTERNALLY RAISED GEOMETRIC SHAPES

(75) Inventor: Rogelio Delgado, Jr., Rosston, AR (US)

(73) Assignee: Klipsch LLC, Indianapolis, IN (US)

( * ) Notice: Subject to any disclaimer, the term of this patent is extended or adjusted under 35 U.S.C. 154(b) by 19 days.

(21) Appl. No.: 11/897,379

(22) Filed: Aug. 30, 2007

(65) Prior Publication Data

US 2009/0057052 A1 Mar. 5, 2009

(51) Int. Cl.
*G10K 11/00* (2006.01)
*G10K 13/00* (2006.01)
*H05K 5/00* (2006.01)
*H04R 1/20* (2006.01)
*H04R 17/04* (2006.01)

(52) U.S. Cl. ....................... 181/192; 181/148; 181/157; 181/159; 181/166; 381/75; 381/340

(58) Field of Classification Search ................. 181/192, 181/166, 159, 157, 148; 381/75, 340
See application file for complete search history.

(56) References Cited

U.S. PATENT DOCUMENTS 1,365,249 A 1/1921 Koehler
1,381,430 A 6/1921 Phipps
1,397,733 A 11/1921 Herzog
1,415,462 A 5/1922 Morrell
1,468,437 A 9/1923 Beniot et al.
1,526,819 A 2/1925 Amoroso
1,760,377 A 5/1930 Shaw
1,767,679 A 6/1930 Hutchison
1,874,733 A 8/1932 Zwikker
1,992,268 A 2/1935 Wente
2,001,089 A 5/1935 Blattner
2,071,153 A 2/1937 Abrahams
2,310,243 A 2/1943 Klipsch
2,537,141 A * 1/1951 Klipsch ...................... 181/187
2,690,231 A * 9/1954 Levy et al. .................. 181/192
2,897,292 A 7/1959 Van Den Bosch
3,563,336 A 2/1971 Miller
3,852,529 A * 12/1974 Schafft ........................ 381/75
3,935,925 A 2/1976 Koiwa et al.
3,972,385 A * 8/1976 Hino et al. .................. 181/192
4,071,112 A 1/1978 Keele, Jr.
4,091,891 A * 5/1978 Hino et al. .................. 181/185
4,152,552 A 5/1979 Meyer
4,171,734 A 10/1979 Peveto et al.
4,187,926 A 2/1980 Henricksen et al.
4,308,932 A 1/1982 Keele, Jr.
4,310,065 A 1/1982 Kayman
4,324,313 A * 4/1982 Nakagawa .................. 181/192
4,348,549 A 9/1982 Berlant
4,465,160 A 8/1984 Kawamura et al.

(Continued)

*Primary Examiner*—Jeffrey Donels
*Assistant Examiner*—Christina Russell
(74) *Attorney, Agent, or Firm*—Krieg DeVault LLP

(57) ABSTRACT

A horn and a loudspeaker employing the horn are disclosed that include a body having a throat that expands outwardly to a mouth such that a first interior area defined by the throat is smaller than a second interior area defined by the mouth. A plurality of raised surface areas is located on an interior surface of the body. The raised surface areas extend into a hollow interior defined by the body a predetermined distance and are utilized to channel sound waves through the body and out the mouth.

26 Claims, 13 Drawing Sheets

U.S. PATENT DOCUMENTS

| | | | | |
|---|---|---|---|---|
| 4,469,921 | A | 9/1984 | Kinoshita | |
| 4,580,655 | A * | 4/1986 | Keele, Jr. | 181/192 |
| 4,629,029 | A | 12/1986 | Gunness | |
| 4,923,031 | A | 5/1990 | Carlson | |
| 5,285,025 | A | 2/1994 | Yoshioka | |
| 5,304,746 | A * | 4/1994 | Purvine | 181/148 |
| 6,094,495 | A * | 7/2000 | Rocha | 381/340 |
| 6,574,344 | B1 | 6/2003 | Wiener et al. | |
| 6,628,796 | B2 * | 9/2003 | Adamson | 381/342 |
| 6,658,128 | B1 * | 12/2003 | Yoshioka et al. | 381/340 |
| 6,668,969 | B2 | 12/2003 | Meyer et al. | |
| 6,712,177 | B2 | 3/2004 | Ureda | |
| 6,950,530 | B2 * | 9/2005 | Baird et al. | 381/343 |
| 7,027,605 | B2 * | 4/2006 | Werner | 381/99 |
| 7,044,265 | B2 * | 5/2006 | Murphy | 181/192 |
| 7,068,805 | B2 * | 6/2006 | Geddes | 381/340 |
| 7,203,329 | B2 * | 4/2007 | Alexander et al. | 381/340 |
| 2003/0133584 | A1 * | 7/2003 | Werner | 381/338 |
| 2006/0285711 | A1 * | 12/2006 | Song | 381/340 |

* cited by examiner

ACOUSTIC HORN HAVING INTERNALLY RAISED GEOMETRIC SHAPES

BACKGROUND

The present invention relates generally to acoustic loudspeakers and, more particularly, to an acoustic horn including geometric shapes operable to provide smoother frequency coverage patterns.

A horn speaker is a form of a loudspeaker that uses a horn to increase the overall efficiency of a driver of the horn speaker. The driver is typically a diaphragm that is driven by an electromagnet. Horns can be viewed as an acoustic impedance transformer that provides impedance matching between the relatively dense diaphragm medium of the driver and the air. In a speaker system, the diaphragm is the high impedance source and the air is the low impedance receiver. The horn assists the solid-air impedance transformation by acting as an impedance transformer.

SUMMARY

One embodiment of the present application discloses a horn that includes internally raised geometric shapes. Other embodiments include unique apparatus, devices, systems, and methods of providing a horn speaker that includes a horn having internally raised geometric shapes that increase the sound quality of the horn speaker by way of providing improved coverage area. Further embodiments, forms, objects, features, advantages, aspects, and benefits of the present application shall become apparent from the detailed description and figures included herewith.

BRIEF DESCRIPTION OF THE DRAWINGS

The figures are not necessarily to scale, emphasis instead being placed upon illustrating the principles of the invention. Moreover, in the figures, like reference numerals designate corresponding parts throughout the different views.

DETAILED DESCRIPTION

Figure 1:
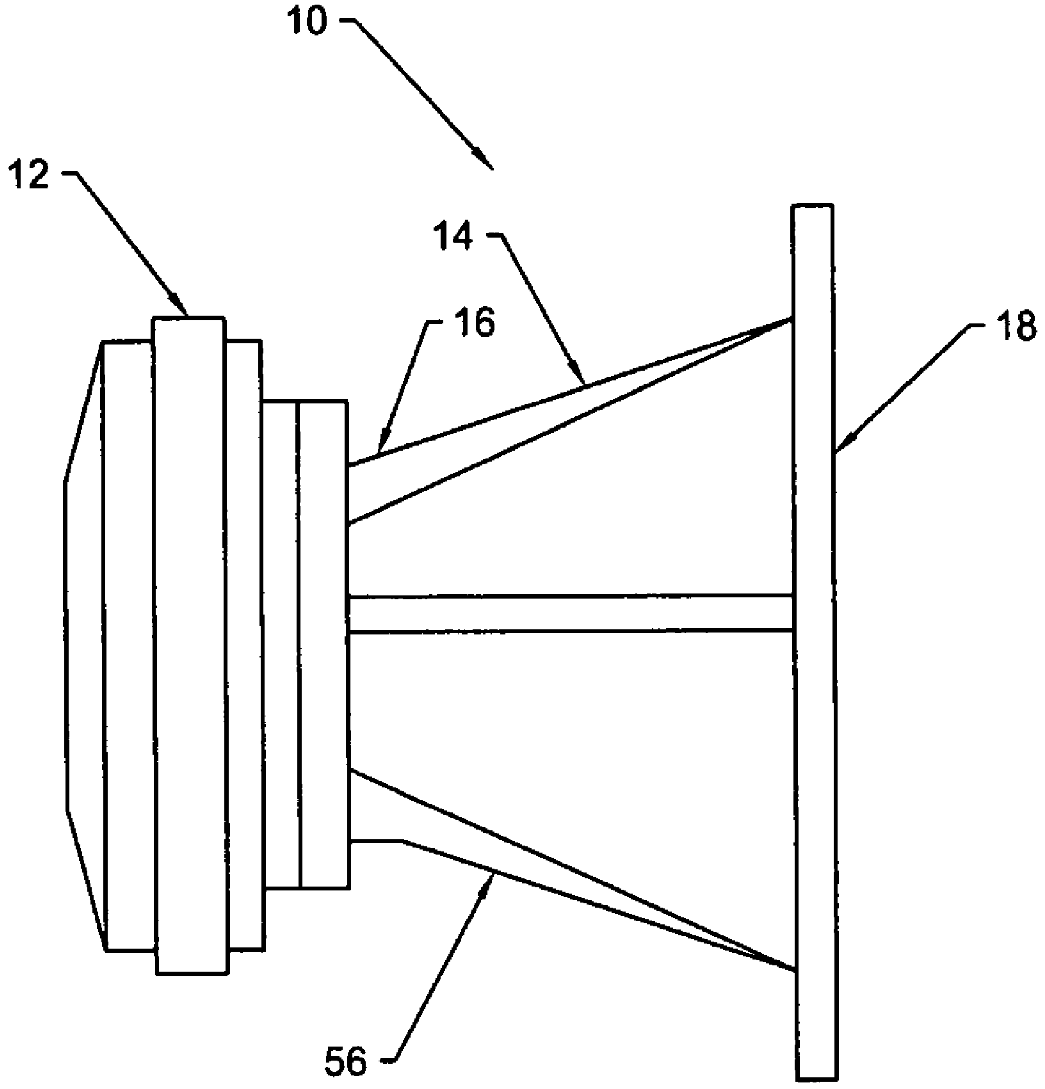
FIG. 1 is a side view of an illustrative loudspeaker.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention is illustrated therein being contemplated as would normally occur to one skilled in the art to which the invention relates.

Referring to FIG. 1, an acoustic horn loudspeaker 10 is illustrated that is operable to convert electrical signals into sound waves. Horn speaker 10 includes a driving element or driver 12 and a horn 14. Driver 12 is connected with one respective end of horn 14. In particular, driver 12 is connected with a throat portion or segment 16 of horn 14. In one form, driver 12 comprises a compression driver that includes a sound producing area that is operable to produce sound waves in response to an electrical audio signal. The sound producing area of the driver 12 is positioned such that acoustic sound waves are directed through an aperture in the horn 14.

As illustrated, throat portion 16 of horn 14 transitions or expands outwardly towards a mouth portion or segment 18 of horn 14. In the form illustrated in FIG. 1, horn 14 is depicted as having a generally cone shaped expanding area (i.e.—an expanding cone shaped cross-sectional configuration), but as set forth in greater detail below, other shaped horns may incorporate the teachings of the present invention. For example, horn 14 could have a generally square shaped cross-sectional configuration, a rectangular shaped cross-sectional configuration, a radially shaped cross-sectional configuration, a parabolic shaped cross-sectional configuration, a exponentially shaped cross-sectional configuration, a hyperbolic shaped cross-sectional configuration, a tractrix shaped cross-sectional configuration or a combination of the above.

Figure 2:
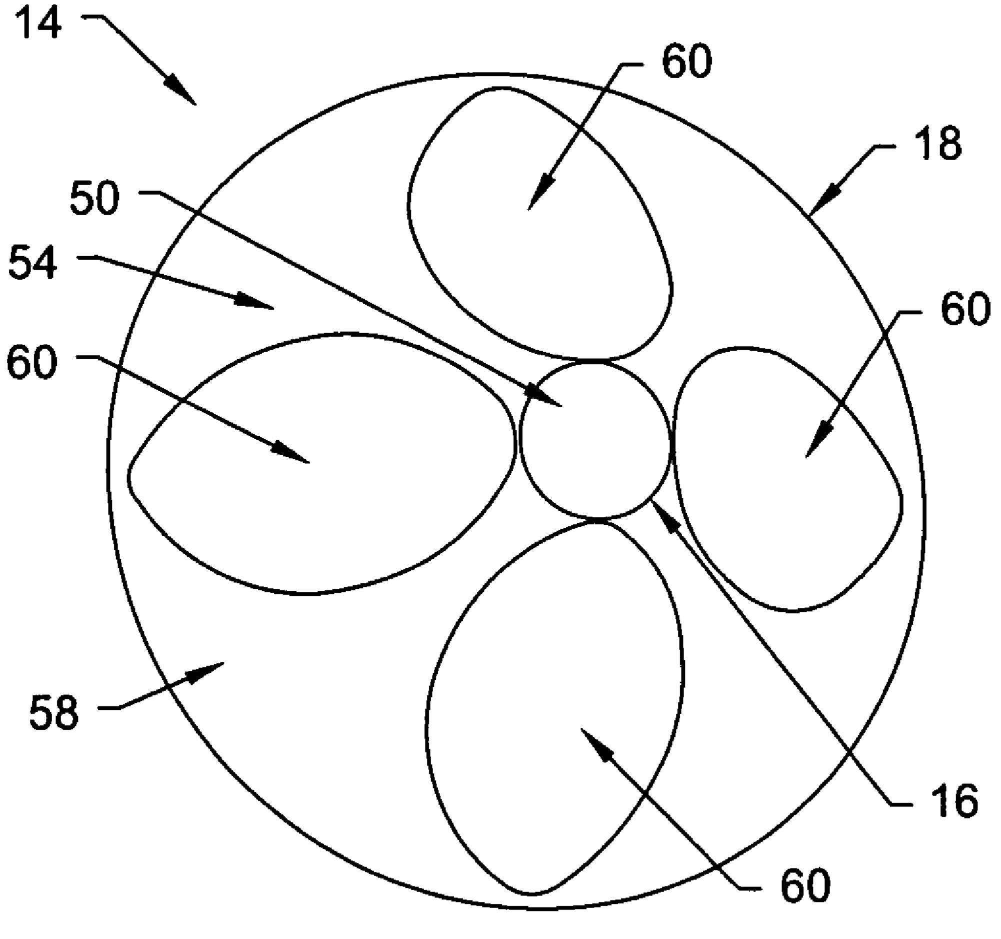
FIG. 2 is a perspective view of a representative horn for a loudspeaker.

Referring collectively to FIGS. 1 and 2, a front perspective view of horn 14 is illustrated in FIG. 2. As previously set forth, horn 14 includes throat portion 16 and mouth portion 18. The part of horn 14 proximate to the compression driver 12 is throat 16 and the larger part of horn 14 farthest away from the throat 16 is mouth 18. Horn 14 includes an aperture 50 located at the throat portion 16 of horn 14. As previously set forth, driver 12 is connected with the throat 16 such that at least a portion of the sound producing area of driver 12 is exposed through the aperture 50. As illustrated in FIG. 2, horn 14 is generally geometrically shaped as described by an equation or combination of equations. A horn, as that term is commonly used, is a three-dimensional geometric shape defined by an equation or set of equations.

As illustrated in FIGS. 1 and 2, horn 14 includes an exterior surface 56 and an interior surface 58. Throat portion 16 extends outwardly to mouth portion 18 such that an expansion contour is defined between the throat portion 16 and mouth 18. Lateral surface 54 thereby defines a cone-shaped structure or body that defines a hollow interior space having a small opening at the throat portion 16 and a larger opening at the mouth portion 18. Although a portion of the interior surface 58 of horn 14 is generally shaped as a smooth surface, other interior areas of horn 14 include one or more raised surface areas 60. As illustrated, at least one surface area 60 extends away from the interior surface 58 of the horn 14. In one form, surface areas 60 raise upwardly in relation to interior surface 58 into the hollow interior. Surface areas 60 increase the total interior surface area of horn 14 and alter the expansion rate of the horn 14. In one form, surface areas 60 are integrally formed or molded as part of horn 14. As such, in this form, horn 14 is integrally molded as one piece.

In one representative form, surface areas 60 have a generally elliptical or ovate shape, but other geometric shapes are envisioned and may be utilized. For example, surface areas 60 can be shaped in an acuminate shape, an orbicular or circular shape, a triangular shape, a spatulate shape, a aristate shape, a lanceolate shape, and so forth. In one form, surface areas 60 extend generally from throat portion 16 to mouth portion 18 on the interior surface 58 of horn 14, however, surface areas 60 may extend shorter lengths along the length of horn 14 as well. The shape of horn 14 is determined by an equation or set of equations that describe the expanding area.

In yet another form, horn 14 includes a predetermined number of raised areas 60. In particular, horn 14 includes four raised areas 60 spaced an equal radial distance from one another on the interior surface 58 of horn 14. In the illustrated form, surface areas 60 are spaced 90° apart from one another with respect to a central axis of horn 14. The height of surface areas 60 in relation to interior surface 58 is dependent upon the size or area of throat portion 16, the size or area of mouth portion 18, and the length of horn 14.

Figure 3:
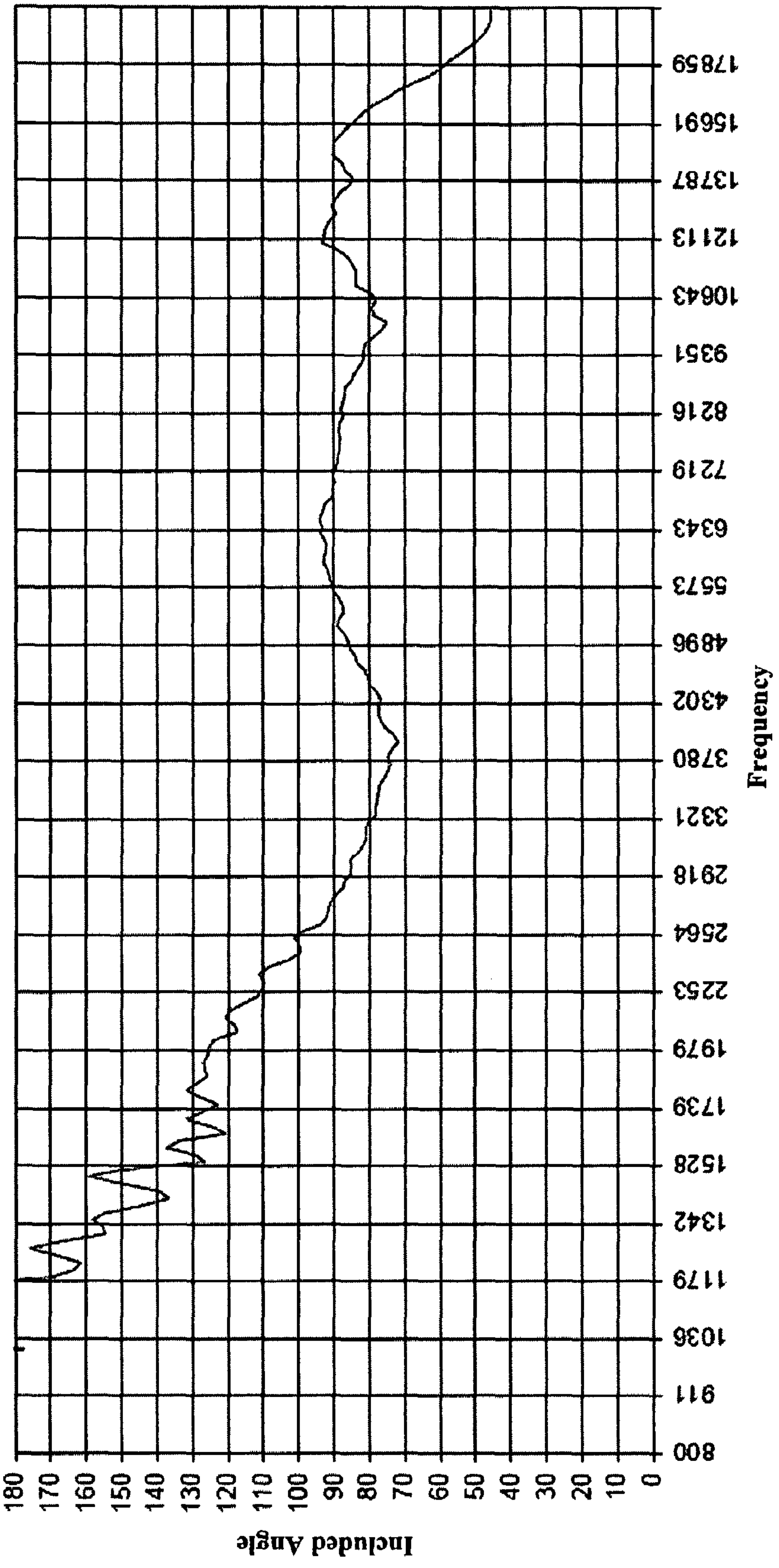
FIG. 3 is a diagram showing the coverage pattern of the horn illustrated in FIG. 2.
Figure 4:
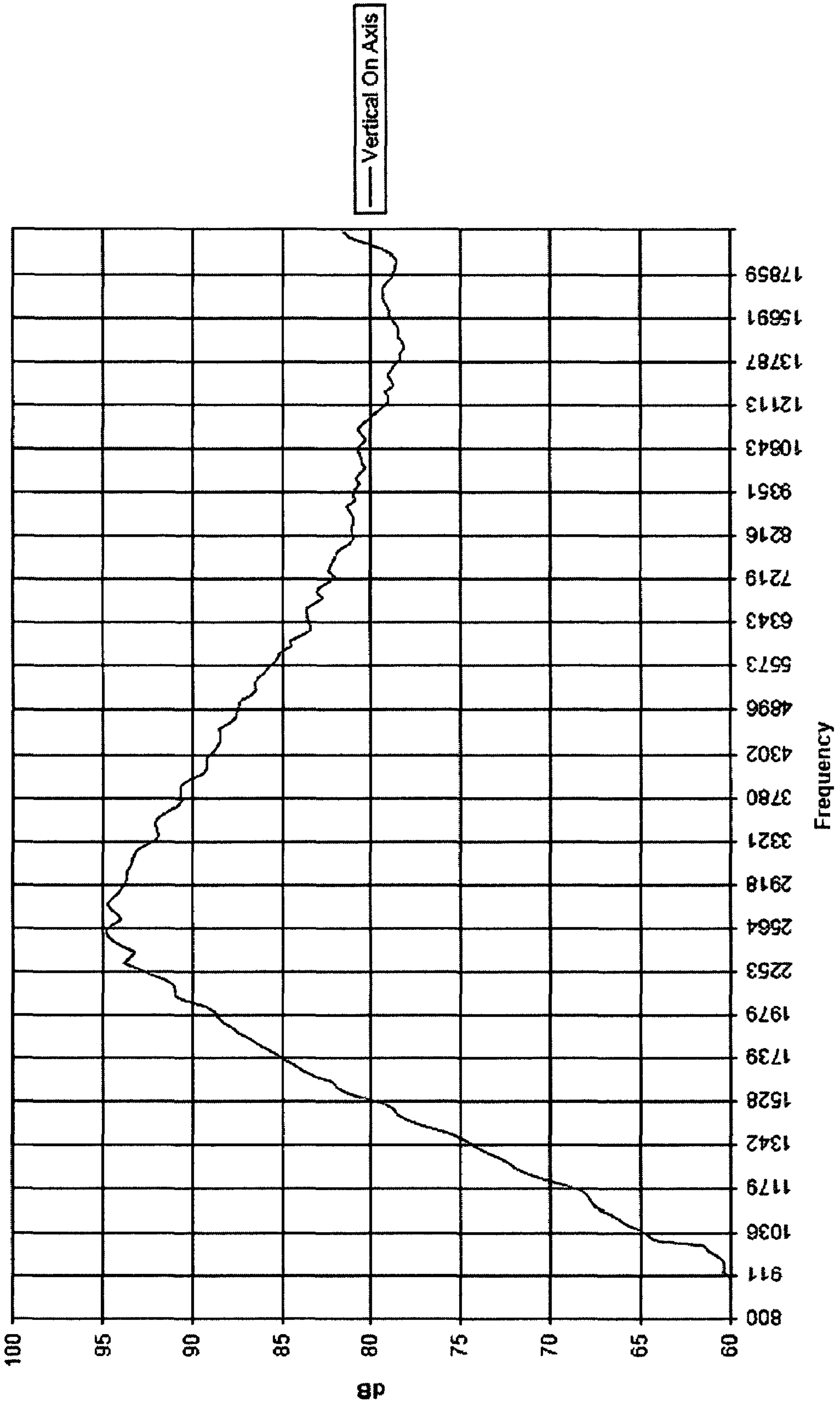
FIG. 4 is a frequency response for the horn illustrated in FIG. 2.
Figure 5:
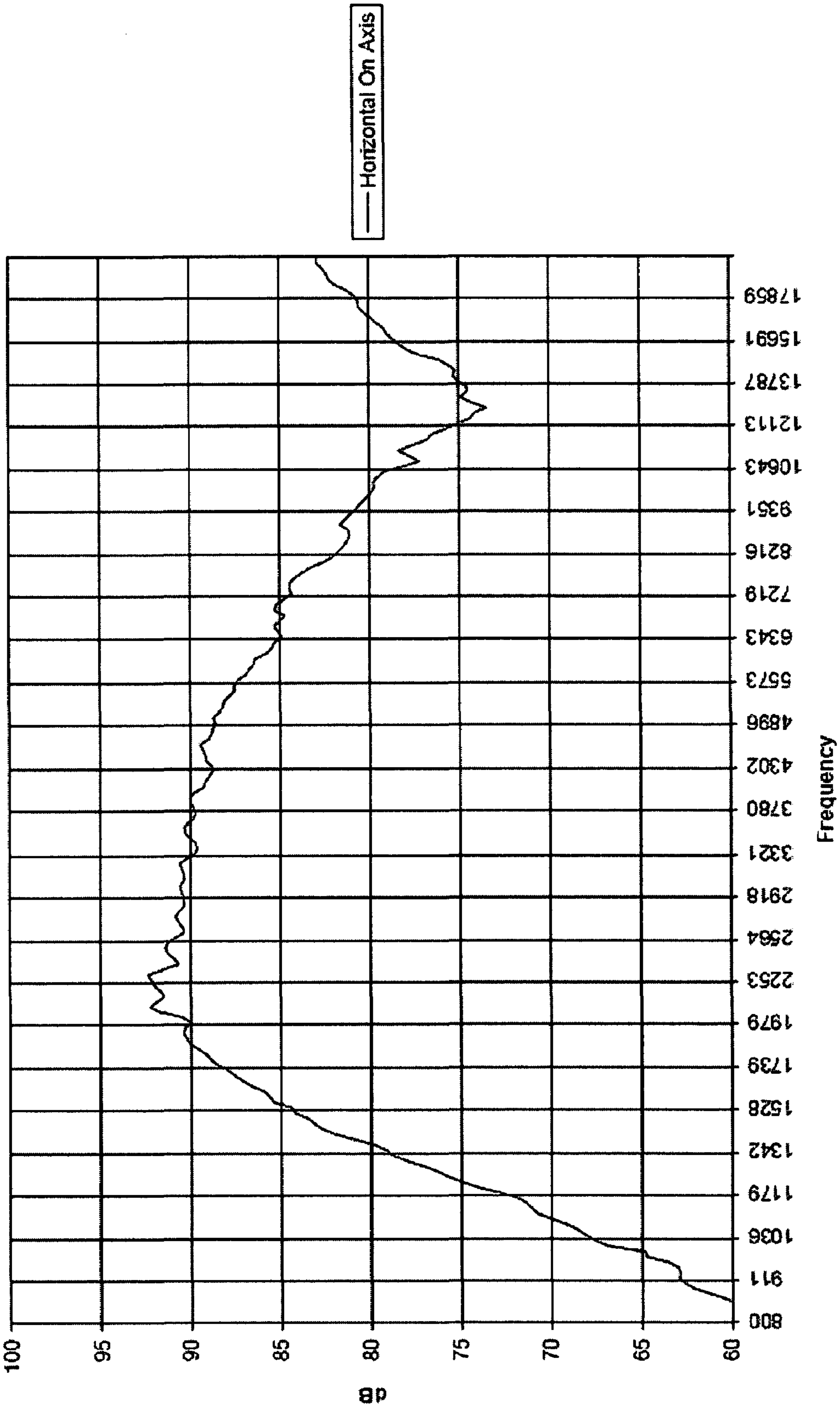
FIG. 5 is a frequency response for a prior art cone shaped horn.
Figure 6:
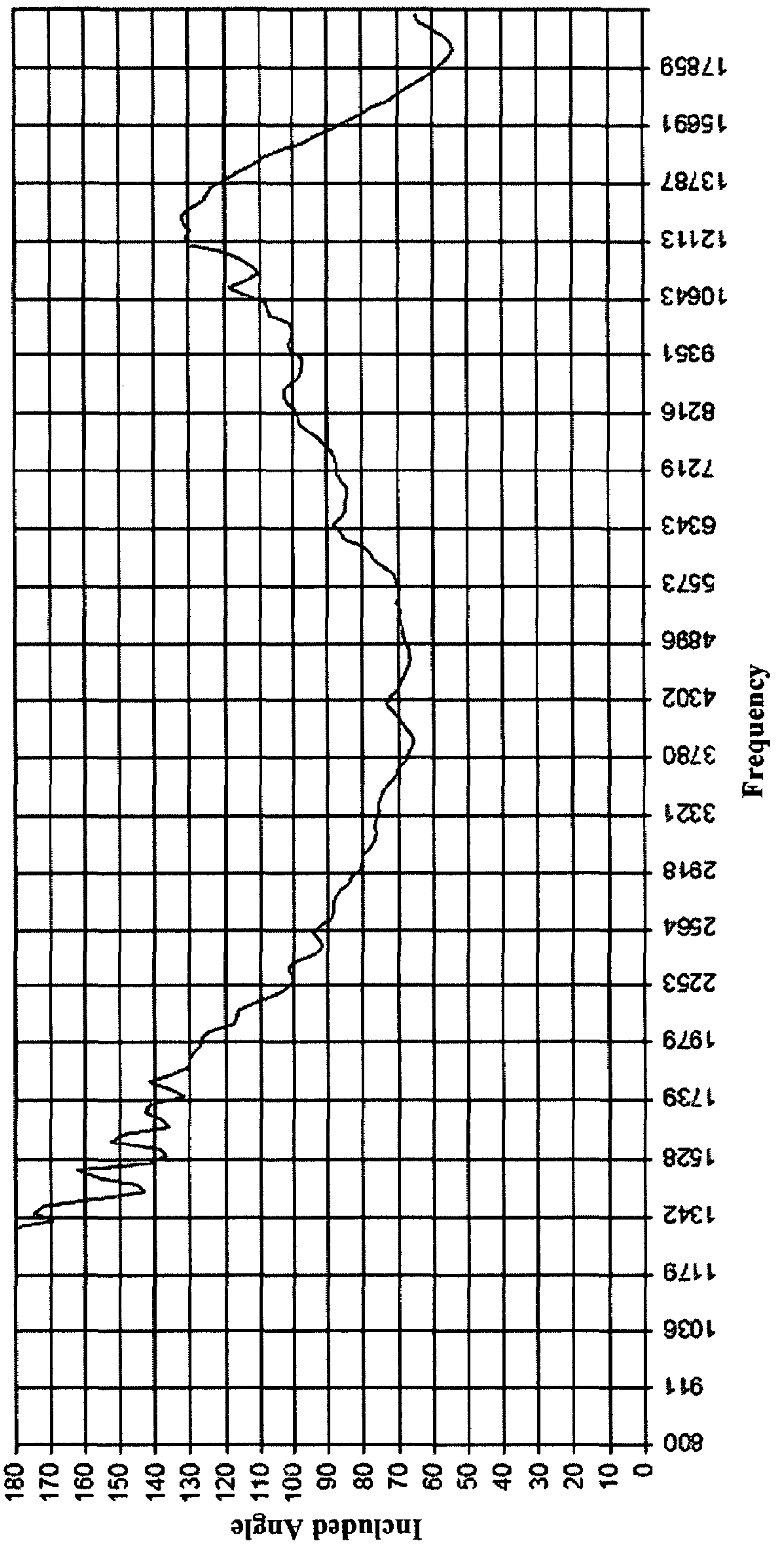
FIG. 6 is a coverage pattern for a prior art cone shaped horn.

Referring to FIG. 3, a coverage pattern curve is set forth that illustrates the coverage pattern of horn 14 illustrated in FIG. 2 at various frequencies. As known to those skilled in the art, wide coverage patterns across large frequency ranges are difficult to achieve in horn loudspeakers. As illustrated in FIG. 3, horn 14 that includes surface areas 60 is capable of achieving wide coverage patterns across a broad range of frequencies. Since the interior area of horn 14 set forth in FIG. 2 is generally symmetrically shaped, the coverage pattern curve set forth in FIG. 3 covers both vertical and horizontal coverage patterns. Referring to FIG. 4, a frequency response curve is illustrated for horn 14 in FIG. 2. Inclusion of surface areas 60 on horn 14 minimally changes the frequency response of horn 14 compared to prior horn designs that are not capable of providing the consistent wide coverage pattern of horn 14. A frequency response curve of prior horn designs without surface areas 60 is illustrated in FIG. 5 and FIG. 6 illustrates the horizontal coverage pattern of prior horn designs without surface areas 60.

Figure 7:
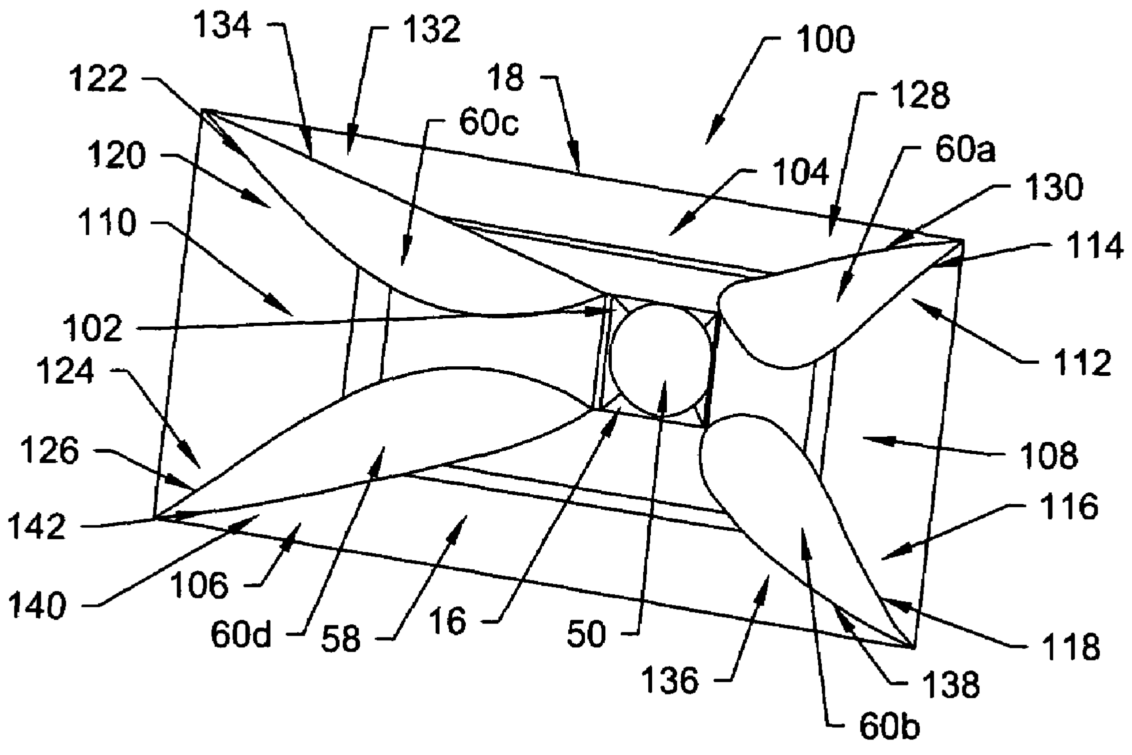
FIG. 7 is another representative horn.

Referring to FIG. 7, wherein like reference numerals designate corresponding elements found in FIG. 2, another representative form of a horn 100 is depicted. As illustrated, in this form, horn 100 has a generally rectangular shape or configuration. Horn 100 includes a generally rectangular base 102 that includes aperture 50. In this form, driver 12 is connected with base 102 in such a manner that at least a portion of the exit of driver 12 is exposed through aperture 50. Extending outwardly from the edges of base 102 are an upper side wall 104, a lower side wall 106, a right side wall 108, and a left side wall 110. In one form, walls 104-110 extend straight out from base 102, but in other representative forms one or more sets of respective walls 104-110 may curve outwardly as well.

As illustrated, the upper and lower side walls 104, 106 define a first set of vertical side walls. Right and left side walls 108, 110 define a second set of horizontal side walls. Walls 104, 106 run substantially perpendicular with walls 108, 110. Walls 104-110 define an expanding generally rectangular shaped hollow interior that has a larger cross-sectional area at the mouth portion 18 of horn 100 than at the throat portion 16 of horn 100. As set forth in detail below, outside edges of walls 104-110 are connected with respective surfaces of raised surfaces areas 60*a-d*. Raised surface areas 60*a-d* increase the overall surface area of the hollow interior defined by walls 104-110 and raised areas 60*a-d* thereby altering the expansion rate of horn 100. As illustrated in both FIGS. 2 and 7, a surface area in a central portion of the raised areas 60, 60*a-d* is larger than the surface area near the throat 16 and the surface area near the mouth 18.

In one form, instead of the right side wall 108 being connected with upper side wall 104 and lower side wall 106, an upper portion 112 of right side wall 108 is connected with an outside edge 114 of a first raised surface area 60*a*. In addition, a lower portion 116 of right side wall 108 is connected with an outside edge 118 of a second raised surface area 60*b*. Likewise, an upper portion 120 of left side wall 110 is connected with an outside edge 122 of a third raised surface area 60*c* and a lower portion 124 of left side wall 110 is connected with an outside edge 126 of a fourth raised surface area 60*d*.

As further illustrated, a right side 128 of upper side wall 104 is connected with an outside edge 130 of raised surface area 60*a*. A left side 132 of upper side wall 104 is connected with an outside edge 134 of raised surface area 60*c*. A right side edge 136 of lower wall 106 is connected with an outside edge 138 of raised surface area 60*b*. In addition, a left side edge 140 of lower wall 106 is connected with an outside edge 142 of raised surface area 60*d*. As illustrated in FIG. 7, walls 104-110 together with raised surface areas 60*a-d* define a flower-shaped cavity in horn 100.

Figure 8:
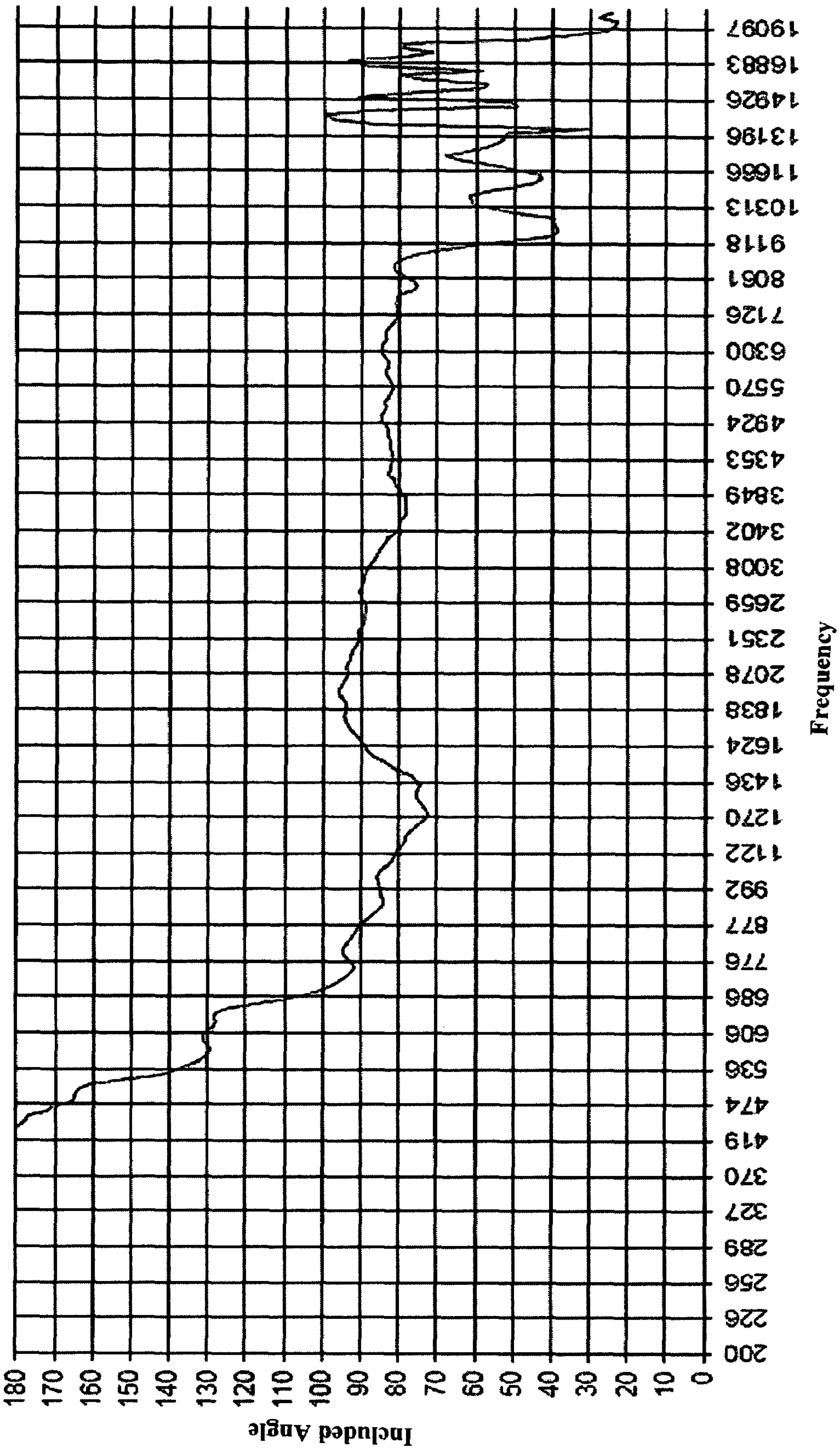
FIG. 8 is a diagram showing the horizontal coverage pattern of the horn illustrated in FIG. 7.
Figure 9:
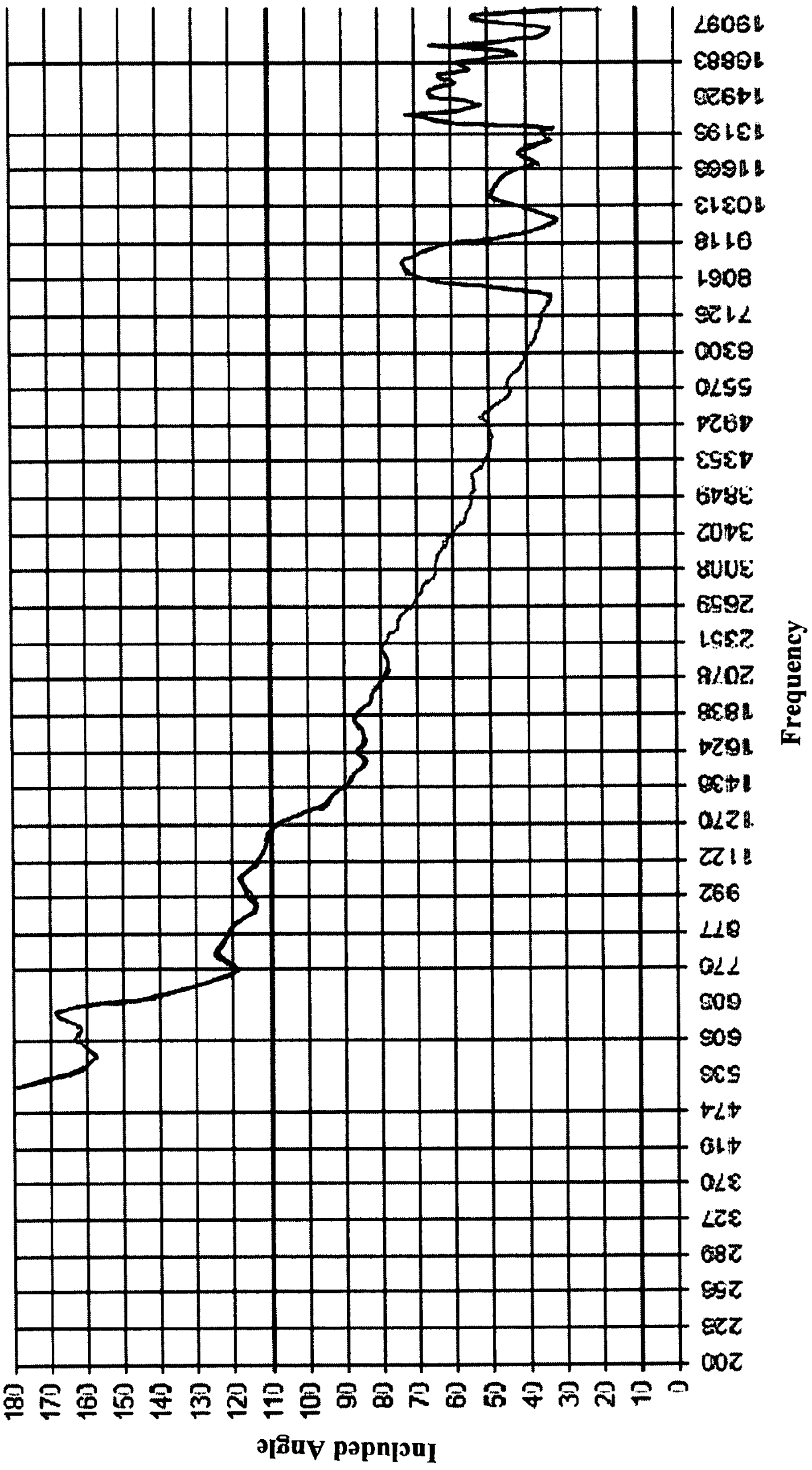
FIG. 9 is a diagram showing the vertical coverage pattern of the horn illustrated in FIG. 7.
Figure 10:
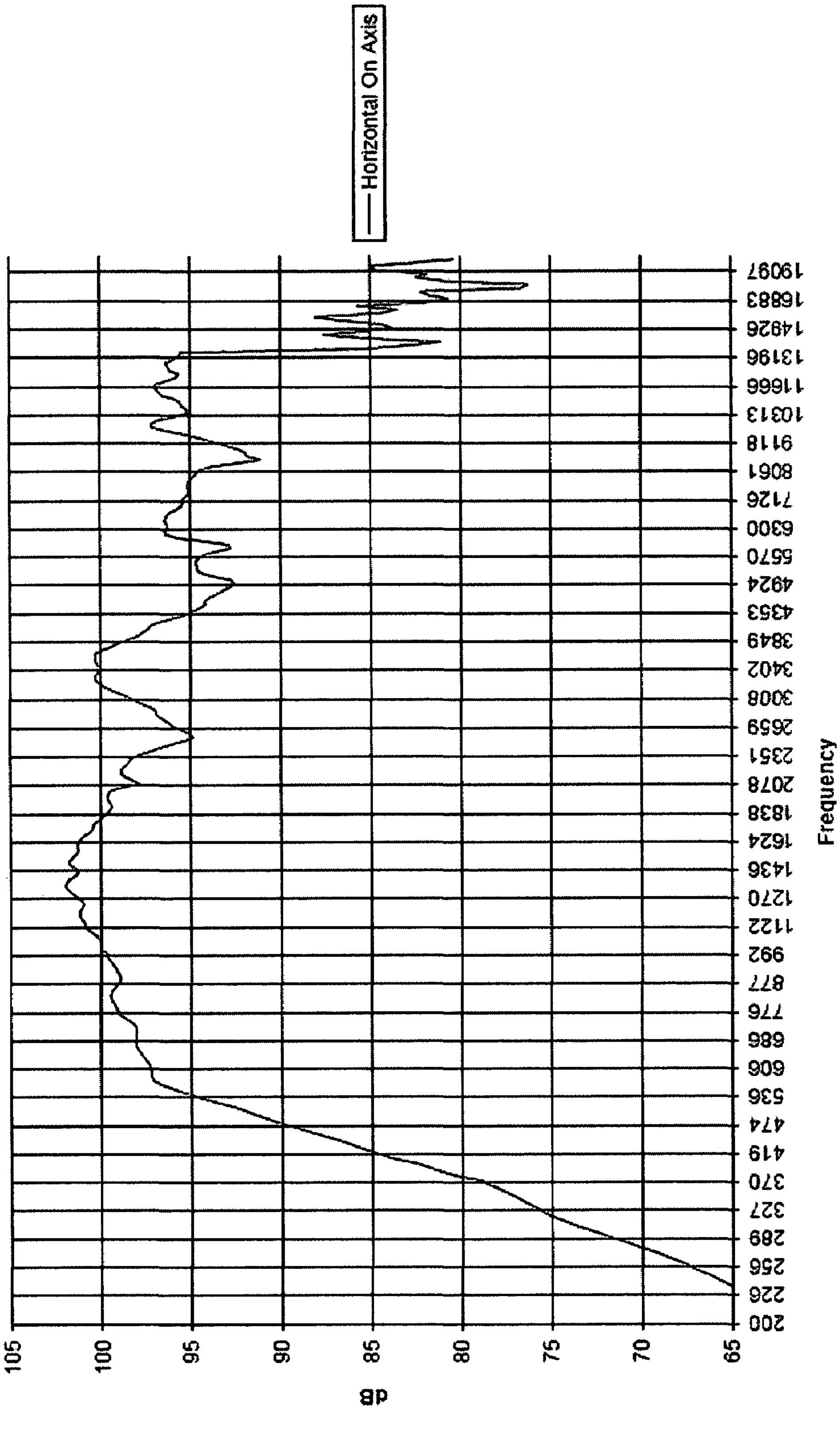
FIG. 10 is a diagram showing the frequency response of the horn illustrated in FIG. 7.
Figure 11:
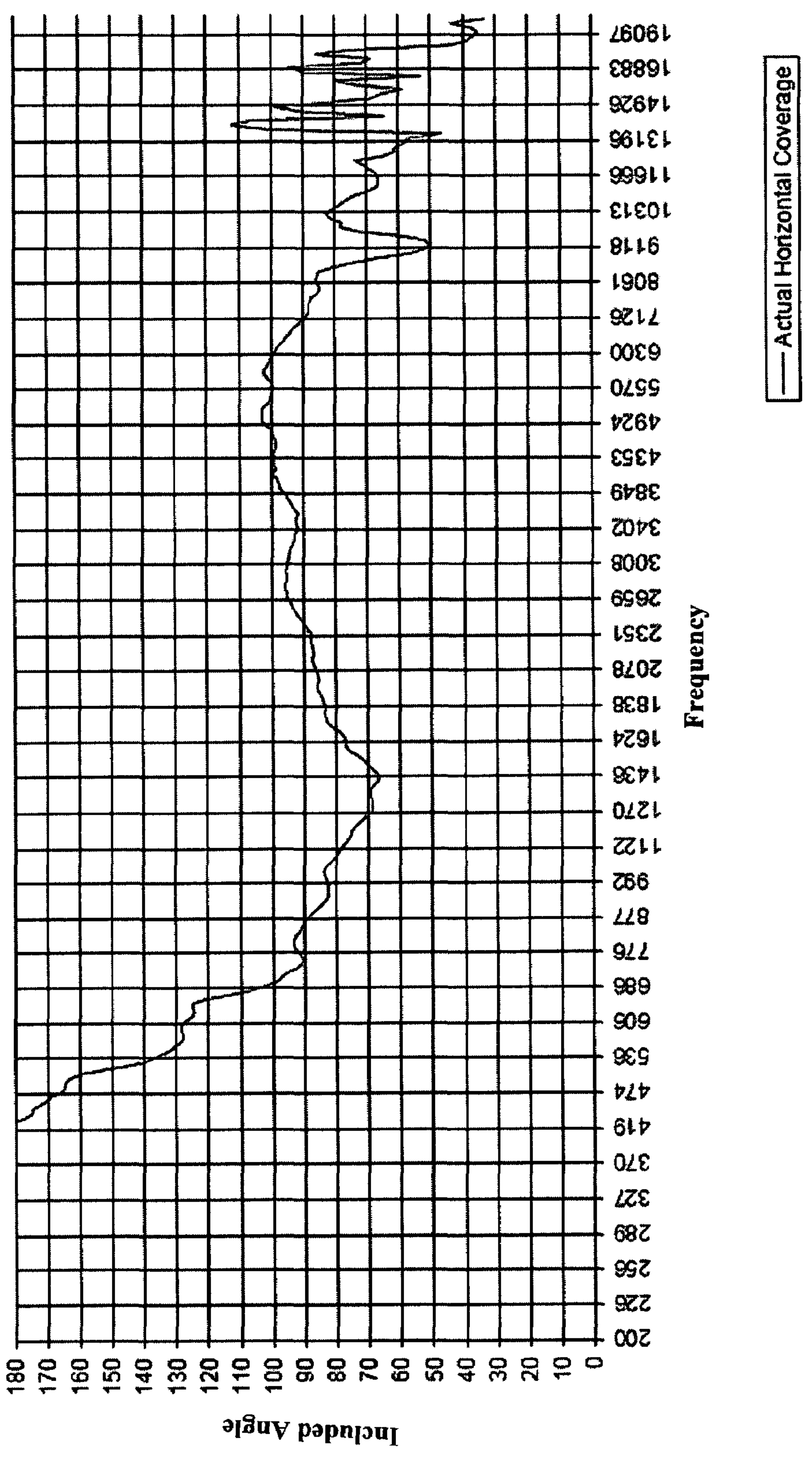
FIG. 11 is a diagram showing a horizontal coverage pattern of a prior art rectangular horn.
Figure 12:
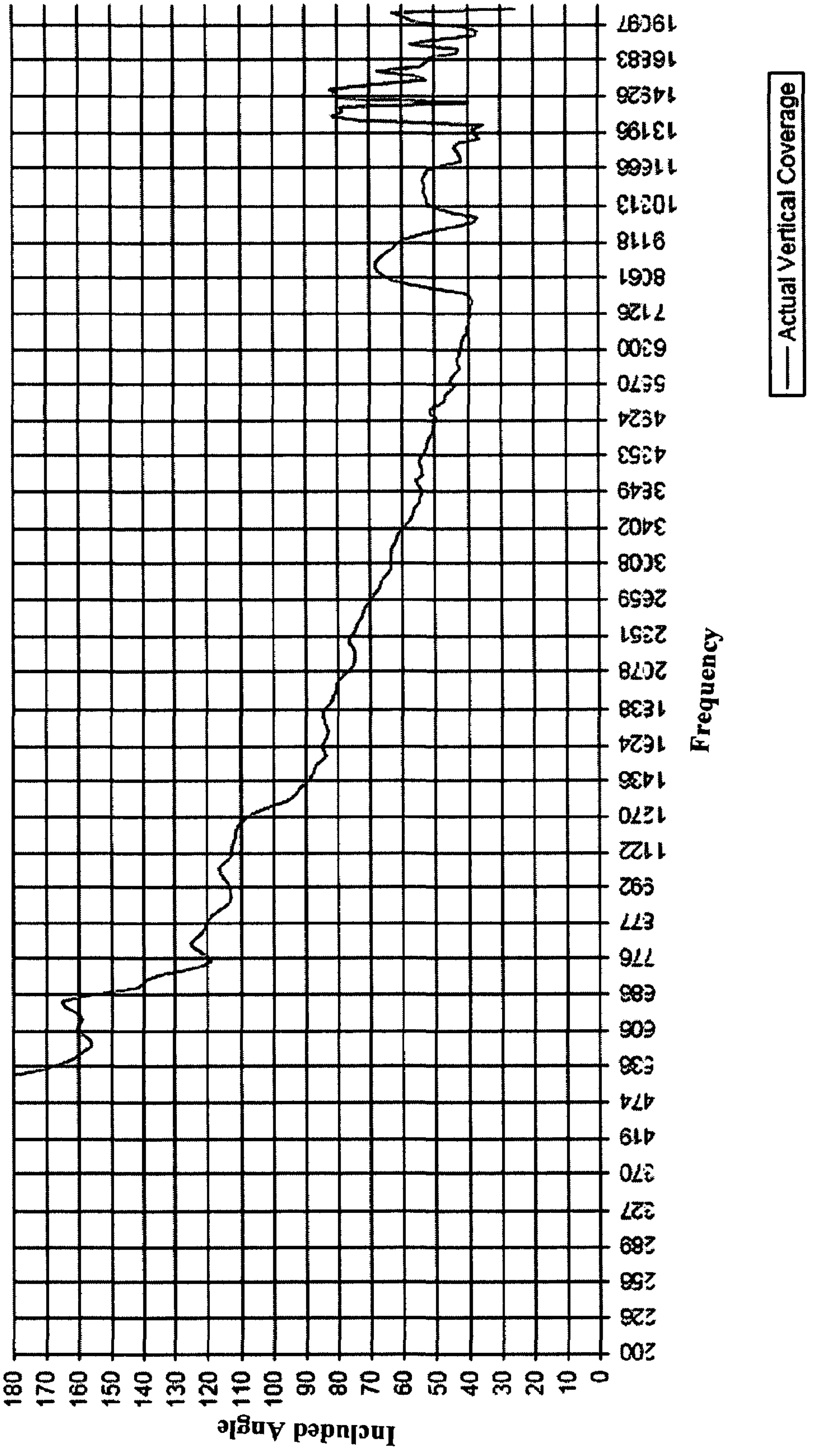
FIG. 12 is a diagram showing a vertical coverage pattern of a prior art rectangular horn.
Figure 13:
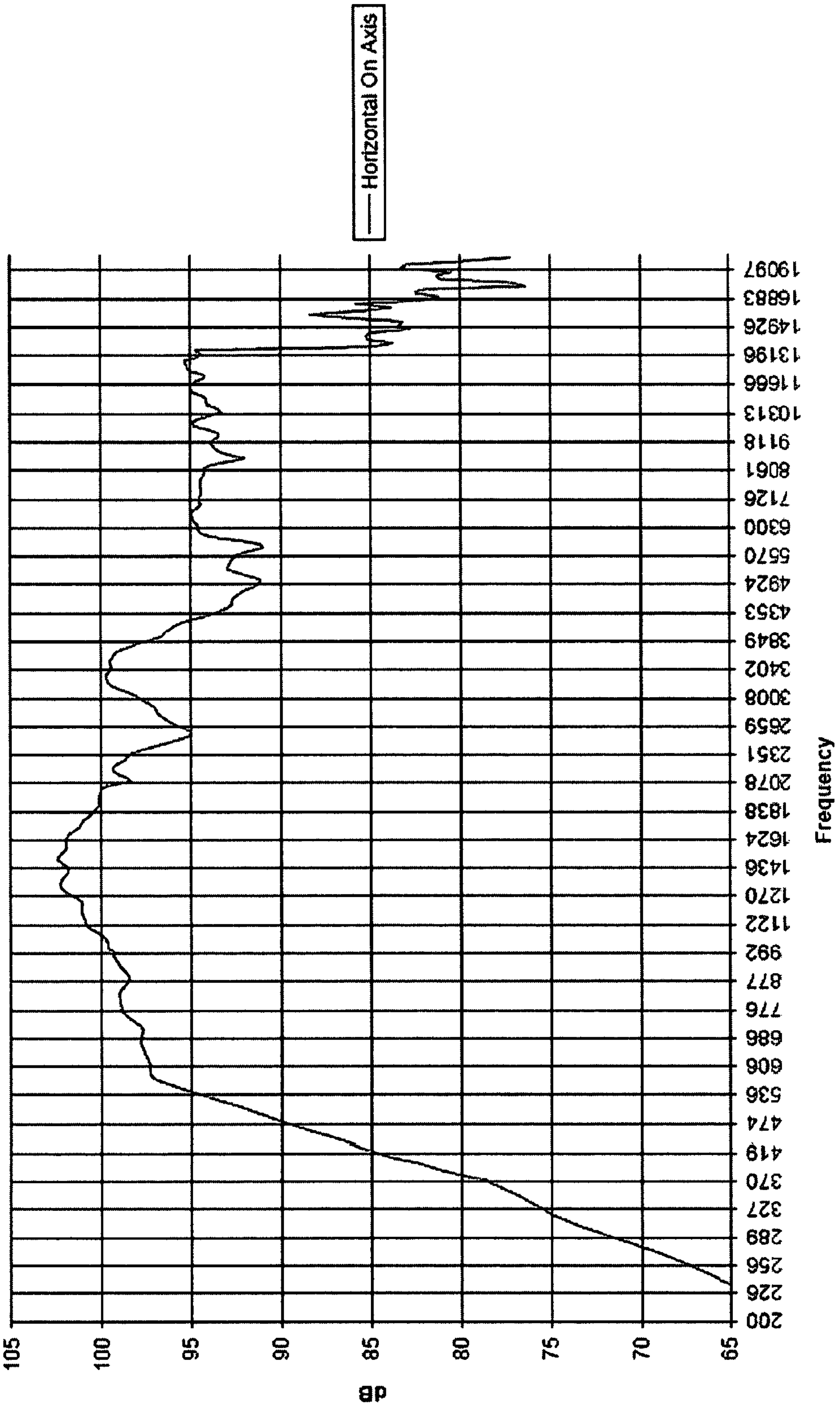
FIG. 13 is a diagram showing the frequency response of a prior art rectangular horn.

Referring to FIG. 8, a horizontal coverage pattern curve is set forth that illustrates the horizontal coverage pattern of horn 100 illustrated in FIG. 7 at various frequencies. As illustrated in FIG. 8, horn 100 that includes surface areas 60*a-d* is capable of achieving wide horizontal coverage patterns across a broad range of frequencies. Referring to FIG. 9, a vertical coverage pattern curve is set forth that illustrates the vertical coverage pattern of horn 100. Horn 100 is also capable of achieving wide vertical coverage patterns across a broad range of frequencies. Referring to FIG. 10, a frequency response curve is illustrated for horn 100. Inclusion of surface areas 60*a-d* on horn 100 minimally changes the frequency response of horn 14 compared to prior horn designs that are not capable of providing the consistent wide coverage pattern of horn 14. A horizontal coverage pattern of prior rectangular horn designs without surfaces areas 60*a-d* is illustrated in FIG. 11 and a vertical coverage pattern of prior rectangular horn designs is illustrated in FIG. 12. A frequency response curve for prior rectangular horn designs is illustrated in FIG. 13.

As set forth above, one aspect of the present invention discloses a horn for a loudspeaker. The horn includes a body having a throat extending outwardly to a mouth such that an expansion contour is defined between the throat and mouth. The body includes an interior surface and an exterior surface. An interior surface of the body includes a surface area that extends away from the interior surface of the body.

In one form, the surface area extends upwardly from the interior surface of the body into a hollow interior area defined by the expansion contour. The surface area has a generally elliptical shape. The surface area extends from approximately the mouth to approximately the throat of the body. A height associated with the surface area is calculated as a function of a size of the horn as defined by the expansion contour between the throat and the mouth. In another form, a plurality of surface areas are included that are equally radially spaced about a center axis of the body.

Another form of the present invention discloses a horn for a loudspeaker, comprising: a body including a throat that expands outwardly to a mouth such that a first interior area defined by the throat is smaller than a second interior area defined by the mouth; and a plurality of raised surface areas located on an interior surface of the body.

In one form, the body has a generally rectangular shape having a first set of side walls that run generally perpendicular to a second set of side walls. At least a portion of the plurality of raised surfaces areas are positioned between the first set of side walls and the second set of side walls. The plurality of raised surface areas may have a generally acuminate shape.

Yet another form of the present invention discloses a loudspeaker capable of generating sound waves. The loudspeaker comprises a horn having a body that expands horizontally and vertically from a throat portion to a mouth portion to define a generally hollow interior area, wherein the body includes an interior surface and an exterior surface; a raised surface area on the interior surface of the body extending into the generally hollow interior area of the body; and a driver connected with the throat portion of the body such that at least a portion of a sound producing area of the driver is exposed through an aperture located in the throat portion.

In one form, he body includes a first set of vertical side walls and a second set of horizontal side walls that define an expanding generally rectangular shaped hollow interior. A first end of the raised surface area is located on a first side of a respective one of the vertical side walls and a second end of the raised surface area is located on a second side of a respective one of the horizontal side walls that is located adjacent the first side. In another form, a plurality of raised surface areas is located on the interior surface of the body that extend into the generally hollow interior area of the body, wherein the plurality of raised surface areas are positioned such that the vertical and horizontal side walls do not intersect one another but are connected with respective sides of the plurality of raised surface areas.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A horn for a loudspeaker, comprising:

a body including a throat extending outwardly to a mouth such that an expansion contour is defined between the throat and mouth, wherein the body includes an interior surface and an exterior surface; and a raised surface area on the body extending inwardly from the interior surface of the body toward an interior area defined by the body that alters an expansion rate of the expansion contour defined between the throat and mouth at the location of the raised surface area, wherein a surface area in a central portion of the raised surface area is larger than surface areas near the throat and mouth, wherein the raised surface area is configured to cause the horn to maintain a wide coverage pattern.

2. The horn of claim 1, wherein the raised surface area increases a total interior surface area of the body.

3. The horn of claim 1, wherein the raised surface area has a generally elliptical shape.

4. The horn of claim 1, wherein the raised surface area extends from approximately the mouth to approximately the throat of the body.

5. The horn of claim 1, wherein a height associated with the raised surface area is calculated as a function of a size of the horn as defined by the expansion contour of the throat and the mouth.

6. The horn of claim 1, further comprising a plurality of raised surface areas extending inwardly from the interior surface of the body thereby altering an expansion rate of the expansion contour defined between the throat and mouth.

7. The horn of claim 6, wherein the plurality of raised surface areas are equally radially spaced about a center axis of the body.

8. The horn of claim 1, wherein the body has a generally circular shaped cross-sectional configuration.

9. The horn of claim 1, wherein the body has a generally rectangular shaped cross-sectional configuration.

10. The horn of claim 1, wherein the body has a generally radial shaped cross-sectional configuration.

11. A horn for a loudspeaker, comprising:

a body including a throat that expands outwardly to a mouth such that a first interior area defined by the throat is smaller than a second interior area defined by the mouth; and a plurality of raised surface areas located on an interior surface of the body that extend inwardly into an interior defined by the body, wherein the plurality of raised surface areas alter an expansion rate of the body where at least a portion of the plurality of raised surfaces are located on the interior surface of the body, wherein a surface area in a central portion of the plurality of raised surface areas is larger than surface areas near the throat and mouth.

12. The horn of claim 11, wherein the body has a generally rectangular shape having a first set of side walls that run generally perpendicular to a second set of side walls.

13. The horn of claim 12, wherein at least a portion of the plurality of raised surfaces areas are positioned between the first set of side walls and the second set of side walls.

14. The horn of claim 13, wherein the plurality of raised surface areas have a generally acuminate shape.

15. The horn of claim 11, wherein the plurality of raised surface areas have a generally elliptical shape.

16. The horn of claim 11, wherein the plurality of raised surface areas extend from approximately the throat to approximately the mouth.

17. The horn of claim 11, wherein the body has a generally truncated cone shape.

18. A loudspeaker, comprising:

a horn having a body that continuously expands outwardly horizontally and vertically from a throat portion to a mouth portion to define a generally hollow interior area, wherein the body includes an interior surface and an exterior surface;

a plurality of raised surface areas on the interior surface of the body extending into the generally hollow interior area of the body, wherein the plurality of raised surface areas alter an expansion rate of the body such that said body no longer has a continuous outwardly expansion rate where at least a portion of said plurality of raised surface areas are located, wherein a surface area in a central portion of the plurality of raised surface areas is larger than respective surface areas near the throat portion and mouth portion; and a driver connected with the throat portion of the body such that at least a portion of a sound producing area of the driver is exposed through an aperture defined by the throat portion.

19. The loudspeaker of claim 18, wherein the body has a generally truncated cone shape.

20. The loudspeaker of claim 18, where the plurality of raised surface areas increase a total interior surface area of the body.

21. The loudspeaker of claim 18, wherein the plurality of raised surface areas are equally radially spaced from one another about a central axis of the body

22. The loudspeaker of claim 18, wherein the plurality of raised surface areas extend approximately from the throat portion to the mouth portion.

23. The loudspeaker of claim 18, wherein the plurality of raised surface areas have a generally elliptical shape.

24. The loudspeaker of claim 18, wherein the body includes a first set of vertical side walls and a second set of horizontal side walls that define an expanding generally rectangular shaped hollow interior.

25. The loudspeaker of claim 24, wherein a first end of a respective one of the raised surface areas is located on a first side of a respective one of the vertical side walls and a second end of the respective one of the raised surface areas is located on a second side of a respective one of the horizontal side walls that is located adjacent the first side.

26. The loudspeaker of claim 24, wherein the plurality of raised surface areas are positioned such that the vertical and horizontal side walls do not intersect one another but are connected with respective sides of the plurality of raised surface areas.

* * * * *